United States Patent
Oliva et al.

(10) Patent No.: US 9,672,310 B1
(45) Date of Patent: Jun. 6, 2017

(54) RELIABILITY GUARDBAND COMPENSATION

(71) Applicant: Apple Inc., Cupertino, CA (US)

(72) Inventors: Antonietta Oliva, San Jose, CA (US); John G. Dorsey, San Francisco, CA (US); Keith Cox, Sunnyvale, CA (US); Norman J. Rohrer, San Jose, CA (US); Sribalan Santhanam, Palo Alto, CA (US); Sung Wook Kang, Santa Clara, CA (US); Mohamed H. Abu-Rama, Mountain View, CA (US); Ashish R. Jain, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 14/795,013

(22) Filed: Jul. 9, 2015

(51) Int. Cl.
*G06F 17/00* (2006.01)
*G06F 17/50* (2006.01)
*G01R 31/28* (2006.01)

(52) U.S. Cl.
CPC ..... *G06F 17/5068* (2013.01); *G01R 31/2875* (2013.01); *G01R 31/2879* (2013.01); *G01R 31/2894* (2013.01)

(58) Field of Classification Search
USPC ........................................................ 716/136
See application file for complete search history.

(56) References Cited

U.S. PATENT DOCUMENTS

| | | | |
|---|---|---|---|
| 7,475,320 B2 | 1/2009 | Knebel et al. | |
| 7,793,119 B2 | 9/2010 | Gammie et al. | |
| 8,248,095 B2 | 8/2012 | Noorlag et al. | |
| 8,766,704 B2 | 7/2014 | Takayanagi | |
| 2006/0267621 A1* | 11/2006 | Harris | G01R 31/2884 324/762.02 |
| 2008/0116455 A1* | 5/2008 | Jain | H03L 1/00 257/48 |
| 2008/0186044 A1* | 8/2008 | Singh | G01R 31/31721 324/750.3 |
| 2008/0186082 A1* | 8/2008 | Singh | H03K 19/00384 327/539 |
| 2012/0266123 A1* | 10/2012 | Jain | G06F 17/5009 716/112 |
| 2014/0165017 A1* | 6/2014 | Barnaby | G06F 17/5081 716/112 |
| 2015/0081039 A1 | 3/2015 | Allen-Ware et al. | |

* cited by examiner

*Primary Examiner* — Mohammed Alam
(74) *Attorney, Agent, or Firm* — Meyertons, Hood, Kivlin, Kowert & Goetzel, P.C.; Lawrence J. Merkel

(57) ABSTRACT

In an embodiment, the amount of supply voltage guardband to prevent incorrect operation due to aging effects may be modeled using an IC-specific age model generated early in the product life cycle of the IC. For example, high temperature operating life (HTOL) testing may be performed at multiple temperatures and/or voltages to develop the IC-specific age model. The IC-specific age model may be more accurate then the calculations used to develop guardband voltage as discussed previously, which rely on the aging of a single transistor. The IC-specific age model may be used along with monitoring of the aging effects during operation of the IC to predict an amount of increased guardband voltage that is currently desirable to apply to the IC. The predicted amount may vary from about zero when the IC is new to the full amount of guardband voltage when the IC is nearing end of life.

20 Claims, 5 Drawing Sheets

RELIABILITY GUARDBAND COMPENSATION

BACKGROUND

Technical Field

Embodiments described herein are related to reliability management for an electronic device.

Description of the Related Art

Electronic devices are typically designed to a target service lifetime, during which the device is expected to operate correctly. Beyond this service lifetime, the device may fail to operate correctly due to wear or other common aging effects. While a given instance of a device may have a defect that causes the device to fail before the lifetime, generally the failure rate prior to the end of the lifetime is expected to be on the order of one in several million instances and often the device, absent a defect, will often last long beyond the service lifetime.

Reliability analysis generally has to do with determining the worst case conditions that can cause the device to fail, and ensuring that the components of the device will not fail more often than the desired failure rate over the desired lifetime under those worst case conditions and to promote a long lifetime for the device. Such determinations are intentionally conservative, and thus numerous devices that do not frequently experience worst-case conditions may have lifetimes that far exceed the design lifetime. While the additional lifetime can be welcome, it can also indicate at the device is over-engineered and possibly more expensive than necessary.

One aspect of wear that occurs in semiconductors is threshold voltage shift ($V_T$ shift). The threshold voltage is the voltage (e.g. gate to source voltage for complementary metal-oxide-semiconductor (CMOS) transistors) that causes non-leakage current flow through the transistor (e.g. the transistor is "on"). With $V_T$ shift, the threshold voltage increases in magnitude, which has the effect of slowing down the operation of digital circuitry formed from the transistors. When the $V_T$ shift is large enough, the increased delays may cause incorrect operation (failure) to occur in the digital circuitry.

Typically, the $V_T$ shift failure problem is addressed by estimating the amount of $V_T$ shift that would occur over worst-case use conditions for the lifetime of the device, and determining an additional amount of supply voltage magnitude which would cause the digital circuitry to still operate correctly in the presence of the estimated $V_T$ shift. That is, increased supply voltage can overcome the increased delay. The semiconductor integrated circuit (IC) is tested at a given supply voltage magnitude (and corresponding operating frequency) and then the additional amount of supply voltage magnitude is added as a "guardband." There can be other supply voltage guardbands for other reasons, and other aging-related issues that cause increased delays for digital circuits can be addressed by guardbanding. The guardbanded supply voltage magnitude is specified as the supply voltage magnitude for operation at the corresponding operating frequency. This mechanism penalizes the ICs early in their lifetimes, as the supply voltage magnitude is higher than required to support correct operation. Either more power is consumed than necessary, or the performance is lower than it could otherwise be because the digital circuitry can be operated at a higher clock frequency and the specified supply voltage.

SUMMARY

In an embodiment, the amount of supply voltage guardband to prevent incorrect operation due to aging effects may be modeled using an IC-specific age model generated early in the product life cycle of the IC. For example, high temperature operating life (HTOL) testing may be performed at multiple temperatures and/or voltages to develop the IC-specific age model. The IC-specific age model may be more accurate then the calculations used to develop guardband voltage as discussed previously, which rely on the aging of a single transistor. The IC-specific age model may be used along with monitoring of the aging effects during operation of the IC to predict an amount of increased guardband voltage that is currently desirable to apply to the IC. The predicted amount may vary from about zero when the IC is new to the full amount of guardband voltage when the IC is nearing end of life.

When a given instance of the IC is new, there may be no guardband applied in the supply voltage for aging effects. As the IC is used, aging effects may be monitored and the IC-specific age model may be used to predict the amount of guardband that is currently desirable to supply to counteract the aging effects. The supply voltage magnitude may be increased by the predicted amount of guardband. Thus, over time, the supply voltage magnitude for a given operating frequency may increase based on the actual usage of the given instance of the IC. Newer IC instances may not be penalized for aging that has not yet occurred, and each instance may have an appropriate supply voltage magnitude for the amount of aging actually experienced by that instance.

BRIEF DESCRIPTION OF THE DRAWINGS

The following detailed description makes reference to the accompanying drawings, which are now briefly described.

Figure 1:
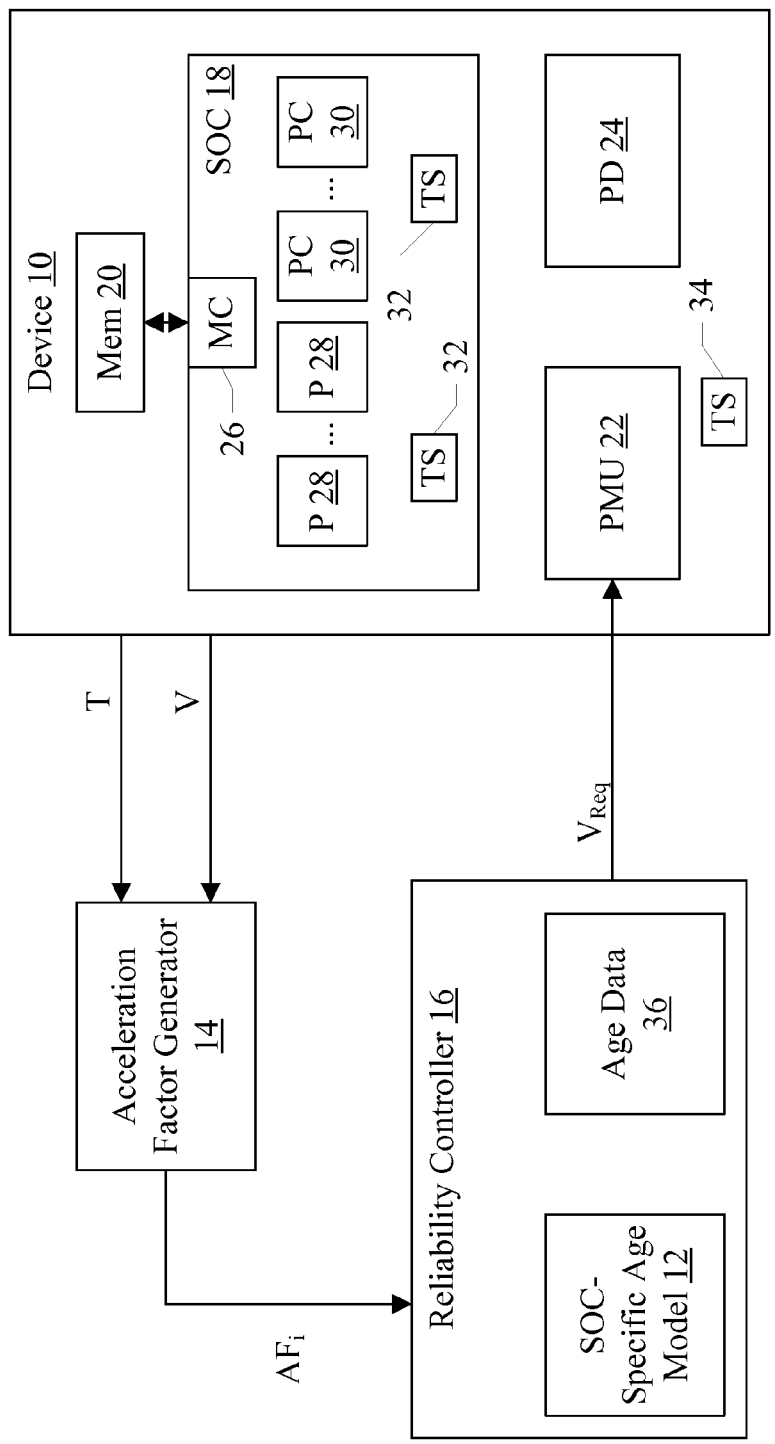
FIG. 1 is a block diagram of a system implementing one embodiment of reliability guardband control.

While embodiments described in this disclosure may admit to various modifications and alternative forms, specific embodiments thereof are shown by way of example in the drawings and will herein be described in detail. It should be understood, however, that the drawings and detailed description are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

In various embodiments, a system may include an electrical device for which reliability is to be managed. The electrical device may be any device. For example, the electrical device may include any of the following in some embodiments: an integrated circuit, two or more integrated circuits, one or more integrated circuits mounted on a board with one or more other components, etc. The electrical device may be part of a product or the entire product, in various embodiments. The electrical device may have one or more operating parameters that are monitored to manage reliability. Operating parameters may be any data that represents the operating conditions of the device. Exemplary parameters may include one or more supply voltage magnitudes, one or more supply current magnitudes, one or more operating temperatures, one or more operating clock frequencies, etc. Embodiments including a particular electrical device and operating parameters thereof are described in more detail as an example below, but any device and parameters may be used in other embodiments.

FIG. 1 is a block diagram of one embodiment of a system including an electrical device 10, an acceleration factor generator 14, and a reliability controller 16. In the illustrated embodiment, the acceleration factor generator 14 is coupled to receive one or more operating parameters from the device 10 and is configured to generate an instantaneous acceleration factor ($AF_i$). The reliability controller 16 is coupled to receive the instantaneous acceleration factor ($AF_i$). The reliability controller 16 is configured to provide various constraints and/or control data to device 10. For example, the constraints/control data may include a supply voltage magnitude to request, $V_{Req}$ in FIG. 1, and/or a maximum die temperature, $MaxT_d$ (not shown in FIG. 1). The constraints/control data may be generically referred to as "control parameters."

In the embodiment of FIG. 1, the device 10 includes an integrated circuit implementing a system on a chip (SOC) 18, a memory 20, a power management unit (PMU 22), and one or more peripheral devices 24. The SOC 18 may include a memory controller 26, one or more processors 28, and one or more peripheral components 30. The SOC 18 may further include one or more temperature sensors 32, and the device 10 may further include other temperature sensors such as the temperature sensor 34.

In the illustrated embodiment, the monitored operating parameters for reliability management include the operating temperature (T) and supply voltage magnitude (V). The supply voltage magnitude may be the magnitude of the supply voltage to the SOC 18. In some embodiments, the SOC 18 may include multiple supply voltages that may have different magnitudes concurrently during use. The monitored supply voltage magnitude may include each magnitude, in some embodiments. The operating temperature may be measured (e.g. via temperature sensors 32 and/or 34). In one embodiment, the operating temperature may be the die temperature of the SOC 18 (that is, the temperature of the semiconductor substrate in which the SOC 18 is fabricated, as measured by the temperature sensor(s) 32). Other operating temperatures may include the external temperature of the SOC 18 (e.g. the temperature of the package of the SOC 18), the temperature of other components such as the PMU 22, the peripheral devices 24, the device 10 as a whole, etc.). Combinations of various operating temperatures may be used (e.g. an average of several measured temperatures from different points in the device 10). In an embodiment, one or more of the temperatures may be synthesized from other data available to the system. For example, the system may have a model of device thermal transfer characteristics that allows it to calculate an operating temperature from indirect measurements such as input power. The supply voltage magnitude may be a setting in the PMU 22, and thus need not be measured using a sensor, but rather may be recorded. The actual instantaneous supply voltage magnitude may vary due to loading, noise, etc. but may generally be targeted at the supply voltage magnitude setting. Accordingly, the monitored operating parameters may be either measured or recorded from a setting, or any combination thereof.

The acceleration factor generator 14 may receive the monitored parameters and may be configured to generate the instantaneous acceleration factor. The acceleration factor may represent how quickly the values of the monitored operating parameters may lead to aging effects in the SOC and/or end of life (failure) of the device 10. In an embodiment, the acceleration factor may be normalized to nominal values for the operating parameters. That is, the nominal values may be values at which the device 10 may operate continuously over its lifetime without experiencing failure rates greater than a specified target. There may be multiple nominal values (e.g. a curve on a graph of the operating parameters, which in one embodiment may be a straight line). The acceleration factor for the nominal values may be about 1. Values of the operating parameters that are more strenuous than the nominal values (e.g. values that are more likely to cause wear or damage to the device) may have acceleration factors greater than 1 and values of the operating parameters that are less strenuous than the nominal values may have acceleration factors less than 1.

Based on the instantaneous acceleration factors measured over time and an SOC-specific age model 12, the reliability controller 16 may predict an additional amount of supply voltage magnitude for the SOC 18 to account for aging-related wear (e.g. $V_T$ shift), so that the SOC 18 and thus the electrical device 10 may continue to operate correctly at a specified operating frequency in the presence of aging experienced by the SOC 18. The amount of additional supply voltage magnitude may be referred to as "age guardband." On initial power up of the device 10 (e.g. "out of the box" to the owner of the electrical device 10), the age guardband may be zero (or a small predetermined amount to account for non-modeled aging effects, if any). As age is tracked over time by the reliability controller 16, the age guardband may increase. The age guardband may increase faster for $AF_i$ greater than one and slower for $AF_i$ less than one. That is, strenuous use conditions (e.g. high voltages and/or temperatures) cause more aging than lighter stress use cases (lower voltages and/or temperatures). Accordingly, an appropriate amount of age guardband may be applied over time based on the actual usage of the device 10. Newer devices that have not yet experienced much aging may not be penalized with a large guardband. As devices are used, the actual operating conditions may determine the guardband, and thus devices that are used in less strenuous conditions may not be penalized by worst-case assumptions used to generate a static guardband.

The reliability controller 16 may compute the age guardband and may add the guardband to a predetermined voltage magnitude to determine $V_{Req}$. The predetermined magnitude may be the minimum voltage at which the SOC 18 operates properly at a given operating frequency. When the SOC 18 is first powered on ("out of the box"). The predetermined magnitude may also include guardband for other reasons than aging. There may be more than one predetermined voltage magnitude if the SOC 18 may be operated at more than one frequency. Additionally, in some embodiments, the SOC 18 may support multiple voltage domains, each of which may be supplied with a different voltage magnitude. The $V_{Req}$ may be determined for each such voltage. In yet another alternative the reliability controller 16 may be configured to provide the age guardband as $V_{Req}$, and the age guardband may be added to each voltage magnitude to be programmed into the PMU 22 for the SOC 18.

The reliability controller 16 may transmit the $V_{Req}$ voltage magnitude to the PMU 22 to control the requested supply voltage. The $V_{Req}$ voltage magnitude may be provided directly to the PMU 22, or may be programmed into various power states maintained by the operating system of the device 10. The power states may each include a voltage magnitude and operating frequency, and the operating system and/or SOC 18 hardware may select among the power states based on workload, power consumption limitations, thermal limitations, etc.

The SOC-specific age model 12 may be developed during testing of instances of the device 10 or components thereof, such as the SOC 18. The testing may be performed, e.g., early in the device's life in the marketplace, and need not be repeated on each device 10 or SOC 18 as long as the design has not changed and the semiconductor fabrication process used to manufacture the SOC 18 has not changed (i.e. the same "technology node" is being used). Thus, the age model 12 may be SOC-specific in that it is specific to the SOC 18 design and the effects that aging has on that design. The age model 12 may be more accurate than, e.g., a model based on an individual transistor and its aging characteristics.

In an embodiment, HTOL testing at multiple voltages and temperatures may be used to generate the age model 12. HTOL testing is normally performed at a voltage and temperature that exceed the design specifications for the device under test, in order to estimate lifetime for voltages and temperatures that are within design specifications. Thus, the HTOL test is an accelerated aging test, where a lifetime measured in years can be predicted from the HTOL test measured in hours (e.g. on the order of hundreds of hours or thousands of hours). By collecting data on how instances of the SOC 18 react to different voltages and temperatures in HTOL, an empirical model of the aging may be generated.

The reliability controller 16 may accumulate the $AF_i$ over time in the age data 36. Either the individual readings may be retained, or a net amount that represents the total aging that has been experienced since the initial power up of the device 10. The age data 36 may be saved in non-volatile storage (not shown in FIG. 1) to retain the data when the device 10 is powered off. The acceleration factor generator 14 may generate the $AF_i$ at regular intervals and/or may be triggered in response to stressful use conditions (e.g. high temperature).

It is noted that, while acceleration factors are computed and used to monitor aging effects in the present example, other embodiments may monitor the operating parameters (e.g. temperature and supply voltage) directly. Additionally, other embodiments may track operating parameters and generate acceleration factors (possibly using a different table of acceleration factors than those used for the age guardband) to measure other effects and to manage reliability of the device 10.

For example, for such other factors, the $AF_i$ may be compared to a target acceleration factor ($AF_T$) to determine the maximum die temperature ($MaxT_d$) constraint mentioned above. In an embodiment, the target acceleration factor to which the instantaneous acceleration factor is compared may be 1. That is, over time, the instantaneous acceleration factor may be controlled toward this target. Periods of high stress (acceleration factors greater than 1) may be offset by periods of low stress (acceleration factors lower than 1) to arrive at the desired lifetime. The reliability controller may accumulate credit during periods of low stress and may allow that credit to be consumed in periods of high stress before controlling the device 10 to prevent premature failure. In another embodiment, the reliability controller 16 may be initialized at boot with an initial credit. The initial credit represents credit that the reliability controller 16 may consume even if the controller 16 has not yet detected less strenuous operation. The availability of the initial credit may permit early, high performance operation (which may enhance the user experience). To offset the initial credit, the target acceleration factor ($AF_T$) may be computed to be less than one. That is, the target acceleration factor $AF_T$ may recover the consumed credit represented by the initial credit. In one embodiment, the history of acceleration factor differences may be a history since the device was first placed into service (e.g. since the initial boot of the device 10 by the user, after purchase of the device 10 from the manufacturer by the user, or the time since the device was manufactured. In another embodiment, the history of acceleration factor differences may be a history since the most recent boot of the device 10.

The acceleration factor generator 14 and/or the reliability controller 16 may be implemented in any desired combination of hardware circuits and/or memory storing instructions for execution on a processor. In an embodiment, the reliability controller 16 and/or the acceleration factor generator 14 may be executed by the processors 28 in the SOC 18 during operation. The instructions may be stored in the memory 20 and/or may be included in non-volatile memory (e.g. Flash memory) in the device 10.

The SOC 18 may be a single semiconductor substrate on which many system components may be integrated. The processors 28 may include circuitry that implements an instruction set architecture, and thus may execute programs coded to the instruction set architecture employed by the processors. The processors may have any construction and design, included in-order or out-of-order execution, superscalar architecture, pipelined design, etc. Generally, a processor may include any circuitry and/or microcode configured to execute instructions defined in the instruction set architecture. Processors may encompass processor cores implemented on an integrated circuit with other components as a system on a chip (SOC 18) or other levels of integration. Processors may further encompass discrete microprocessors, processor cores and/or microprocessors integrated into multichip module implementations, processors implemented as multiple integrated circuits, etc. The processors may include general purpose processors (sometimes referred to as "application processors") or task-specific processors. The task-specific processors may be processors optimized for the specific tasks (e.g. digital signal processors or graphics processing units). The task-specific processors may also be smaller, lower performance general purpose processors provided to execute the software forming the specific task.

The peripheral components 30 may be on-chip peripherals, as compared to the peripheral devices 24 that may be off-chip. Any set of on-chip peripheral components may be included. For example, various image processing and display peripherals may be included (e.g. image signal processors, cameras, display controllers, graphics processing units (GPUs), etc.). Audio processing peripherals (e.g. digital signal processors (DSPs) and audio processing hardware) may be included. Compression/decompression units (e.g. audio/video compression and decompression) may be included. Audio/video coder/decoders (codecs) may be included. Network peripherals may be included. Peripheral components 30 that control external interfaces to peripheral devices 24 or other circuitry may in the device 10 may be included.

The memory controller 26 may include circuitry to interface to the memory 20 on behalf of the processors 28, the peripheral components 30, and various other circuitry in the SOC 18 and/or device 10. Any type of memory 20 may be supported. For example, the memory 20 may be static random access memory (SRAM), dynamic RAM (DRAM) such as synchronous DRAM (SDRAM) including double data rate (DDR, DDR2, DDR3, DDR4, etc.) DRAM. Low power/mobile versions of the DDR DRAM may be supported (e.g. LPDDR1, LPDDR2, LPDDR3, LPDDR4, mDDR, etc.). The memory controller 26 may include queues for memory operations, for ordering (and potentially reordering) the operations and presenting the operations to the memory 20. The memory controller 26 may further include data buffers to store write data awaiting write to memory and read data awaiting return to the source of the memory operation.

The temperature sensors 32 and 34 may be any type of sensor that reacts in a detectable, predictable way to changes in temperature. The temperature sensors 32 may be implemented on chip in the SOC 18, while the temperature sensors 34 may be discrete sensors included in the system. Any number of on-chip and/or off-chip sensors may be used in various embodiments.

The peripheral devices 24 may be any other components that may be included in the device 10. For example, radio chips for wireless local-area networking (WLAN or "Wi-Fi™"), cellular communications, etc. may be included. Various other types of sensors such as any number of: an accelerometer, a gyroscope (or gyro), a magnetometer, an audio detector (e.g. a microphone), a photodetector that detects light or other electromagnetic energy, an altimeter, a pressure sensor, etc. User interface devices such as a button, a touch screen, a keyboard, a pointing device, a camera, etc. may also be peripheral devices 24.

The PMU 22 may be configured to supply various supply voltages to the SOC 18, the memory 20, and/or the peripheral devices 24. The PMU 22 may be programmable to enable/disable the supply voltages and may be programmable with the selected supply voltage magnitudes for each supply.

Figure 2:
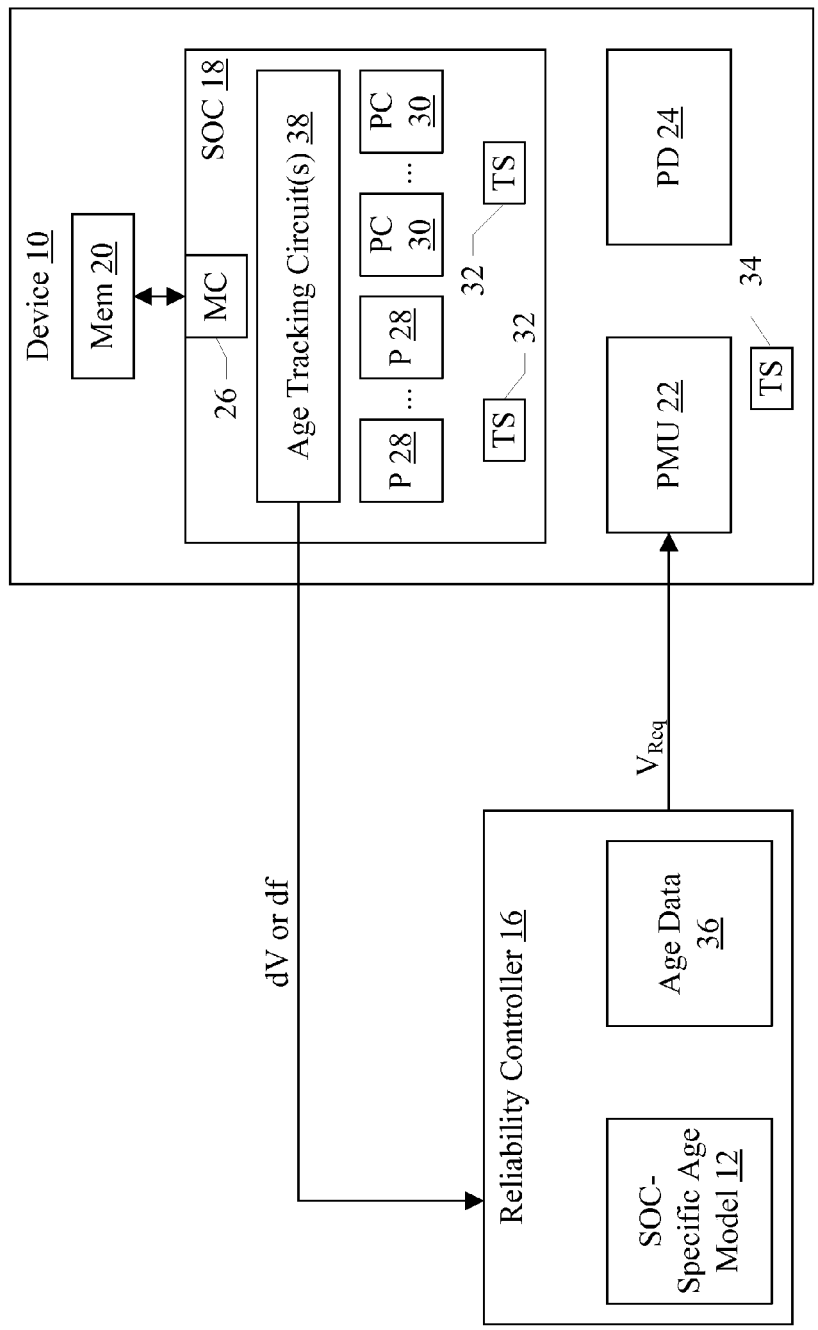
FIG. 2 is a block diagram of a system implementing another embodiment of reliability guardband control.

Turning now to FIG. 2, another embodiment of the system is shown. In the embodiment of FIG. 2, the SOC 18 includes one or more age tracking circuits 38. The age tracking circuits 38 may be designed to mimic critical paths in the SOC 18, and may be measured to determine the aging effects that have accumulated in the SOC 18. For example, the age tracking circuits 38 may construct the critical path mimics as ring oscillators. The frequency of the ring oscillator may be a measure of how quickly the critical path evaluates. At a given supply voltage magnitude, the frequency of the ring oscillator may decrease over time as the aging effects increase. The age tracking circuits 38 may output a frequency, or a change in frequency (delta f, or df in FIG. 2). The SOC-specific age model 12 may be configured to convert that change in frequency to age guardband to recover the frequency to its original (non-aged) value.

In another embodiment, the age tracking circuits 38 and/or control circuitry or software in the reliability controller 16 may shmoo the voltage supplying the age tracking circuits 38 to determine the age guardband that may compensate for the aging affects. The shmoo may run from the minimum supply voltage magnitude to the sum of minimum magnitude and a maximum age guardband that may be applied in the system. The voltage guardband that leads to a correct frequency of operation for the SOC 18 may thus be determined dynamically. The age tracking circuits 38 may supply the change in voltage (age guardband) to the reliability controller 16 (e.g. delta V, or dV, in FIG. 2). In this case, the reliability controller 16 may follow the age guardband in generating the $V_{Reg}$ magnitude.

While ring oscillators of the critical path circuits are described as one embodiment of the age tracking circuits 38, other embodiments may be other types of age tracking circuits 38. For example, in an embodiment, the age tracking circuits 38 may include simple ring oscillator circuits (e.g. not formed to mimic a critical path). The age tracking circuits 38 may include a critical path mimic and delay may be measured rather than forming a ring oscillator around the critical path mimic. The age tracking circuits may include representative circuitry from the SOC 18.

Figure 3:
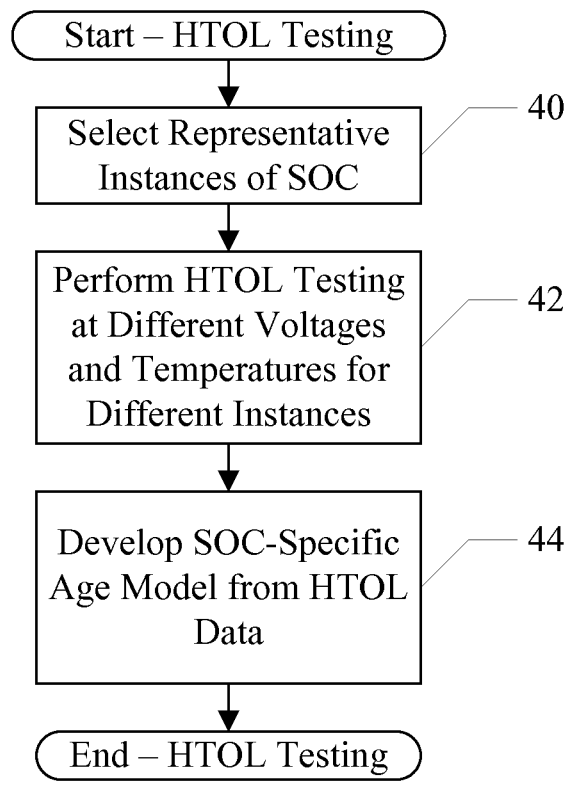
FIG. 3 is a flowchart illustrating an embodiment of HTOL testing of an integrated circuit.

FIG. 3 is a flowchart illustrating one embodiment of HTOL testing of the SOC 18. While the blocks are shown in a particular order for ease of understanding in FIG. 3, other orders may be used. Operations represented by blocks may also be performed in parallel.

For HTOL testing, representative instances of the SOC 18 may be selected (block 40). The representative instances may be selected from different manufacturing lots, different process corners in the semiconductor manufacturing process, etc. to obtain a cross section of variations in the SOC 18. HTOL testing may be performed on the selected instances (block 42). Instances may be tested at different voltages and temperatures. Particularly, at least one instance from each manufacturing lot, processor corner, etc. may be tested at each selected voltage and temperature. In an embodiment, three temperature and voltage settings may be used, and thus there may be at least three instances from each manufacturing lot, processor corner, etc. Data collected from the HTOL testing (e.g. aging effects, measured as increased delays in the circuitry and/or time to failure of the instance) may be analyzed to derive an empirical model of the SOC 18 (block 44). That is, the data may be curve-fit using any desired curve-fitting algorithm to an equation that may be used to calculate the age.

Figure 4:
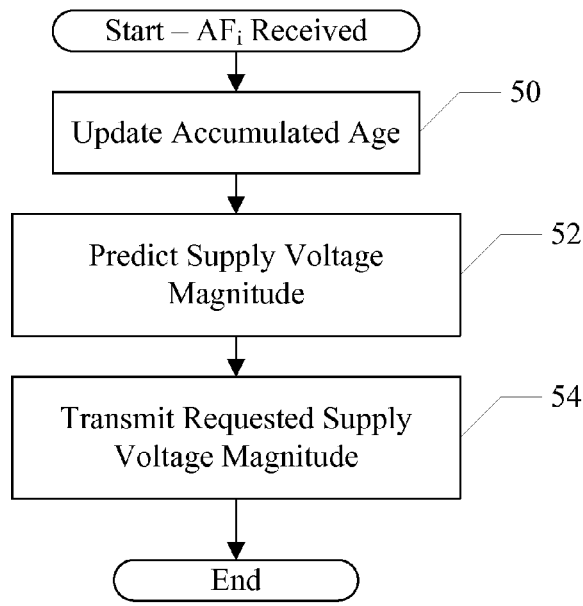
FIG. 4 is a flowchart illustrating an embodiment of reliability guardband control.

FIG. 4 is a flowchart illustrating operation of one embodiment of the reliability controller 16 in response to an acceleration factor (AFi) received from the acceleration factor generator 14. A similar operation may be performed in response to information from the age tracking circuits 38. While the blocks are shown in a particular order for ease of understanding in FIG. 4, other orders may be used. Operations represented by blocks may also be performed in parallel. The reliability controller 16 may include instructions stored in a memory. The instructions, when executed by a processor, implement the operation shown in FIG. 4. The acceleration factor generator 14 may generate a new $AF_i$ on a periodic basis (e.g. once every few seconds, one every few milliseconds, etc. in various embodiments) and/or responsive to stress factor alarms, as mentioned previously.

The reliability controller 16 may be configured to update the accumulated age in the age data 36 responsive to the received $AF_i$ (block 50). With the accumulated age and the SOC-specific age model 12, the reliability controller 16 may be configured to predict the supply voltage magnitude that will result in correct operation of the SOC 18 at the corresponding operating frequency (block 52). The prediction may include determining the age guardband and adding the age guardband to the predetermined power supply voltage magnitude. The reliability controller 16 may be configured to transmit the predicted supply voltage magnitude to the system 10 (e.g. to the PMU 22 or to a power manager in the SOC 18) (block 54)

Figures 5, 6, 7:
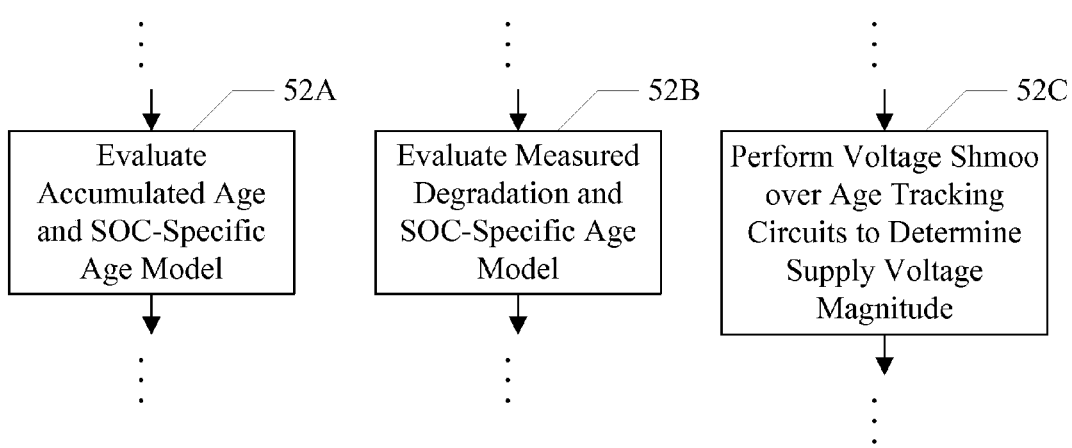
FIG. 5 is a flowchart illustrating an embodiment of a block shown in FIG. 4.
FIG. 6 is a flowchart illustrating another embodiment of a block shown in FIG. 4.
FIG. 7 is a flowchart illustrating still another embodiment of a block shown in FIG. 4.

FIGS. 5, 6, and 7 are flowcharts depicting various embodiments of a portion of block 52 from FIG. 4. The various embodiments may be implemented together, in some cases. FIG. 5 illustrates an embodiment in which the accumulated age is evaluated in the SOC-specific age model 12 to generate the age guardband (block 52A). The embodiment of FIG. 5 may be used, e.g., with the embodiment of FIG. 1. FIG. 6 illustrates an embodiment in which the measured degradation in operation of the age tracking circuits 38 (e.g. the change in operating frequency at a given supply voltage) is used along with the SOC-specific age model 12 to generate the age guardband (block 52B). In this case, the generated guardband may be additional guardband since the currently-requested supply voltage magnitude includes previously generated guardband. FIG. 7 illustrates an embodiment in which a voltage shmoo is performed on the age tracking circuits 38 to determine the supply voltage magnitude (block 52C) at which the age tracking circuits 38 exhibit the correct timing characteristics (e.g. a frequency approximately equal to the desired operating frequency).

Figure 8:
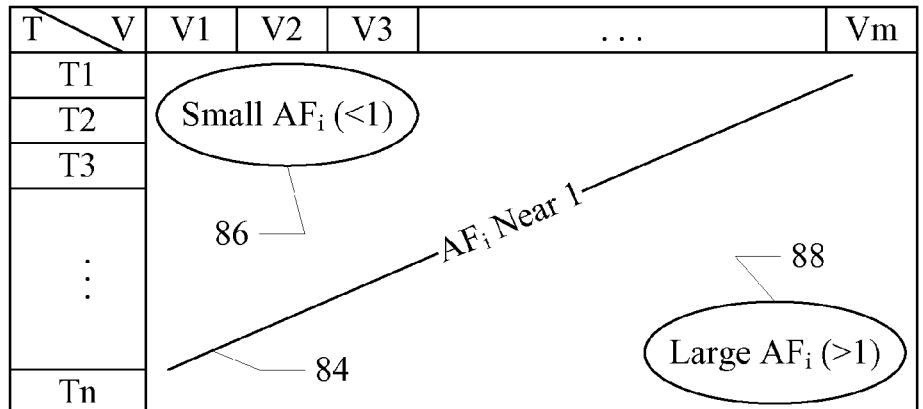
FIG. 8 is a block diagram of one embodiment of a table of acceleration factors.

In an embodiment, the acceleration factor generator 14 may be configured to use a lookup table to convert input temperatures and supply voltage magnitudes to acceleration factors. FIG. 8 is a block diagram of one embodiment of such a table 82. The entries in the table 82 may be populated according to simulation results over the design of the device 10 in various conditions, based on specifications for the components of the device 10, or by other methods. In cases in which a temperature-voltage combination does not explicitly appear in the table 82, interpolation between the values in the table entries may be used to determine $AF_i$.

As mentioned previously, the acceleration factors may be normalized to nominal values. The nominal values may lie along a line near the diagonal 84 from the lower left to the upper right of the table 82. The values in this region of the table may thus be near 1. Lower supply voltage magnitudes and lower temperatures may both induce less wear/damage in the monitored components, and thus entries in the upper left region of the table, above the diagonal 84 may be small acceleration factors (i.e. less than 1)—reference numeral 86 in FIG. 8. Similarly, higher voltage magnitudes and/or temperatures may result in higher acceleration factors above the diagonal 84 (i.e. greater than one)—reference numeral 88 in FIG. 8.

Figure 9:
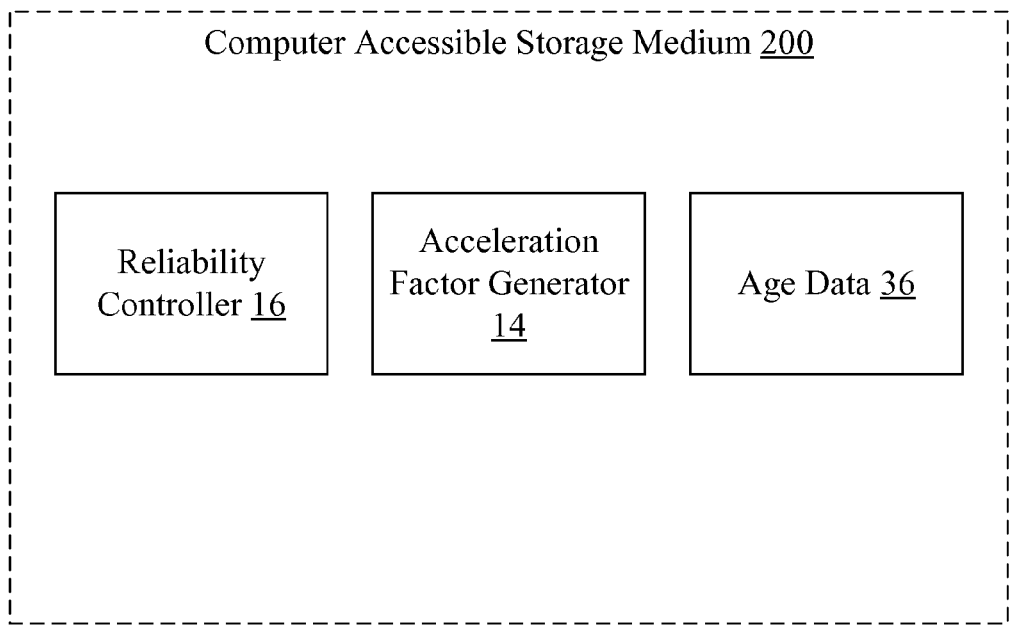
FIG. 9 is a block diagram of one embodiment of a computer accessible storage medium.

FIG. 9 is a block diagram of one embodiment of a computer accessible storage medium 200. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile.

The computer accessible storage medium 200 in FIG. 9 may store code forming the reliability controller 16 and/or the acceleration factor generator 14. The computer accessible storage medium 200 may still further store the accumulated age data 36. The reliability controller 16 may include instructions which, when executed by the processor 28, implement the operation described for the reliability controller 16 above. The acceleration factor generator 14 may include instructions which, when executed by the processor 28, implement the operation described for the acceleration factor generator 14 above. Alternatively, one or more of the above may be implemented partially in hardware and partially in instructions executed by the processor 28. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A system comprising:
an electrical device configured to operate responsive to at least one supply voltage; and
a controller configured to determine a magnitude of the supply voltage to the electrical device to be requested during operation of the electrical device, wherein the magnitude is determined based on a history of one or more parameters that are related to aging experienced by the device and further based on a device-specific age model that determines aging effects on the electrical device based on the one or more parameters, wherein the device-specific aging model is determined by testing physical instances of the electrical device that have been manufactured, wherein:

the magnitude of the supply voltage for the electrical device excludes a voltage magnitude guardband for lifetime reliability at initial power up of the electrical device;

the controller is configured to monitor the one or more parameters during operation of the electrical device; and the controller is configured to increase the magnitude of the supply voltage over time based on monitoring aging effects in the electrical device as indicated by the device-specific aging model evaluated over the one or more parameters detected during the monitoring and determining the increase in the magnitude of the supply voltage from the device-specific aging model.

2. The system as recited in claim 1 wherein the magnitude of the supply voltage corresponds to a specified operating frequency of the electrical device, and wherein the electrical device remains operable at the specified operating frequency over time as the magnitude is increased.

3. The system as recited in claim 1 wherein the electrical device comprises an integrated circuit, and wherein the device-specific age model is developed responsive to high temperature operating life (HTOL) testing of a plurality of physical instances of the integrated circuit.

4. The system as recited in claim 3 wherein the plurality of physical instances are tested at a plurality of supply voltage magnitudes and temperatures in the HTOL testing, and wherein each instance of the plurality of physical instances is tested at a selected one of the plurality of supply voltage magnitudes and temperatures.

5. The system as recited in claim 4 wherein the device-specific age model is generated empirically from data resulting from the HTOL testing of the plurality of physical instances.

6. The system as recited in claim 1 wherein the controller is configured to accumulate age data during operation of the electrical device.

7. The system as recited in claim 6 wherein the age data represents conditions in which the device operated.

8. The system as recited in claim 7 wherein the conditions include operating temperature and supply voltage magnitude.

9. The system as recited in claim 1 wherein the electrical device comprises one or more age tracking circuits configured to output an indication of aging effects detected by the age tracking circuits, wherein the controller is configured convert the indication to an increased magnitude of the supply voltage responsive to the device-specific age model.

10. A method comprising:

powering up an electrical device for an initial boot of the electrical device, wherein a magnitude of at least one supply voltage to the electrical device excludes a voltage magnitude guardband for lifetime reliability at the initial boot;

monitoring one or more parameters during operation of the electrical device, the one or more parameters that are related to aging experienced by the electrical device; and determining the magnitude of the supply voltage to be requested for the electrical device during operation of the electrical device, the determining based on a history of the one or more parameters and further based on a device-specific age model that determines aging effects on the electrical device based on the one or more parameters, wherein the device-specific aging model is determined by testing physical instances of the electrical device that have been manufactured, and the determining includes increasing the magnitude of the supply voltage over time based on aging effects in the electrical device as indicated by the device-specific aging model evaluated over the one or more parameters detected during the monitoring and determining the increase in the magnitude of the supply voltage for the electrical device from the device-specific aging model.

11. The method as recited in claim 10 wherein the magnitude corresponds to a specified operating frequency of the electrical device, and wherein the electrical device remains operable at the specified operating frequency over time as the magnitude is increased.

12. The method as recited in claim 10 wherein the electrical device comprises an integrated circuit, and the method further comprises developing the device-specific age model responsive to high temperature operating life (HTOL) testing of a plurality of physical instances of the integrated circuit.

13. The method as recited in claim 12 wherein the plurality of physical instances are tested at a plurality of supply voltage magnitudes and temperatures in the HTOL testing, and wherein each instance of the plurality of physical instances is tested at a selected one of the plurality of supply voltage magnitudes and temperatures.

14. The method as recited in claim 13 further comprising empirically generating the device-specific age model from data resulting from the HTOL testing of the plurality of physical instances.

15. The method as recited in claim 10 further comprising accumulating age data during operation of the electrical device.

16. The method as recited in claim 15 wherein the age data represents conditions in which the device operated.

17. The method as recited in claim 16 wherein the conditions include operating temperature and supply voltage magnitude.

18. The method as recited in claim 10 wherein the electrical device comprises one or more age tracking circuits configured to output an indication of aging effects detected by the age tracking circuits, and the method further comprises converting the indication to an increased magnitude of the supply voltage responsive to the device-specific age model.

19. The method as recited in claim 18 wherein the indication comprises a change in frequency of operation of the age tracking circuits.

20. A non-transitory computer accessible storage medium storing a plurality of instructions executable by a processor in a system to:

determine a magnitude of at least one supply voltage to be requested for an electrical device during operation of the electrical device based on a history of one or more parameters related to aging experienced by the device and further based on a device-specific age model that determines aging effects on the electrical device based on the one or more parameters, wherein the device-specific aging model is determined by testing physical instances of the electrical device that have been manufactured, wherein:

the magnitude of the supply voltage for the electrical device excludes a voltage magnitude guardband for lifetime reliability at initial power up of the electrical device;

the controller is configured to monitor the one or more parameters during operation of the electrical device; and the plurality of instructions are executable by the processor to increase the magnitude of the supply voltage over time based on monitoring aging effects in the electrical device as indicated by the device-specific aging model evaluated over the one or more parameters detected during the monitoring and determining the increase in the magnitude of the supply voltage from the device-specific aging model.

* * * * *